(12) United States Patent
Chehrazi et al.

(10) Patent No.: US 8,880,013 B2
(45) Date of Patent: *Nov. 4, 2014

(54) GAIN CONTROL IN A SHARED RF FRONT-END PATH FOR DIFFERENT STANDARDS THAT USE THE SAME FREQUENCY BAND

(71) Applicant: Marvell World Trade Ltd., St. Michael (BB)

(72) Inventors: Saeed Chehrazi, Los Angeles, CA (US); Renaldi Winoto, Danville, CA (US); Jinho Park, San Jose, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

This patent is subject to a terminal disclaimer.

(21) Appl. No.: 13/903,324

(22) Filed: May 28, 2013

(65) Prior Publication Data

US 2013/0252565 A1   Sep. 26, 2013

Related U.S. Application Data

(63) Continuation of application No. 13/273,487, filed on Oct. 14, 2011, now Pat. No. 8,467,750.

(60) Provisional application No. 61/405,570, filed on Oct. 21, 2010.

(51) Int. Cl.
*H04B 1/04* (2006.01)
*H04B 1/40* (2006.01)
*H03G 3/30* (2006.01)
*H03G 1/00* (2006.01)

(52) U.S. Cl.
CPC .............. *H04B 1/0458* (2013.01); *H04B 1/406* (2013.01); *H03G 3/3052* (2013.01); *H04B 2001/0416* (2013.01); *H03G 1/0088* (2013.01)
USPC ..................................... 455/127.2; 455/552.1

(58) Field of Classification Search
USPC ............. 455/127.2, 127.3, 216, 232.1, 241.1, 455/250.1, 253.2, 41.2, 552.1
See application file for complete search history.

(56) References Cited

U.S. PATENT DOCUMENTS

| | | | |
|---|---|---|---|
| 6,504,799 B1 * | 1/2003 | Yamashita et al. | 369/44.11 |
| 6,678,224 B2 * | 1/2004 | Yamashita et al. | 369/47.25 |
| 7,042,292 B2 * | 5/2006 | Morohashi et al. | 330/278 |
| 7,209,727 B2 | 4/2007 | Castaneda et al. | |
| 8,121,564 B2 | 2/2012 | Behzad | |
| 8,165,544 B2 | 4/2012 | Tran et al. | |
| 8,340,621 B1 | 12/2012 | Husted | |

* cited by examiner

*Primary Examiner* — Sonny Trinh (57) ABSTRACT

Disclosed is a radio frequency (RF) communication circuit having an input for receiving an RF signal and providing independently gain controlled signal paths from the input. In a first signal path, the signal is amplified by a constant gain. In a second signal path, the signal is amplified by a constant gain and by a variable gain amplifier.

19 Claims, 12 Drawing Sheets

GAIN CONTROL IN A SHARED RF FRONT-END PATH FOR DIFFERENT STANDARDS THAT USE THE SAME FREQUENCY BAND

CROSS REFERENCE TO RELATED APPLICATIONS

This application is a continuation of, commonly-assigned U.S. patent application Ser. No. 13/273,487, filed Oct. 14, 2011 (now U.S. Pat. No. 8,467,750), which claims priority to U.S. Provisional App. No. 61/405,570 filed Oct. 21, 2010, each of which is incorporated herein by reference herein in its entirety for all purposes.

BACKGROUND

The present disclosure relates to radio frequency (RF) circuits, and in particular to gain control circuitry for use in RF circuits.

Unless otherwise indicated herein, the approaches described in this section are not prior art to the claims in this application and are not admitted to be prior art by inclusion in this section.

Two popular wireless standards, Wi-Fi™ and Bluetooth™, are common among portable communication devices. Wireless standards are typically implemented on a chip by chip basis. For example, a system-on-chip (SOC) solution might be developed to process Wi-Fi™ radio frequency (RF) signals which are based on the IEEE 802.11 standard (also referred to as WLAN for Wireless Local Area Network). A separate and different SOC chip solution would be provided to process Bluetooth™ RF signals which are based on a proprietary open standard developed by Ericsson.

The demand for Wi-Fi™ and Bluetooth™ technologies to be provided in the same device is on the rise, as the desire for communication between users and devices increases. On the other hand, the demand for increased functionality, including support for multiple wireless standards, in smart phones, computer tablets, and other such portable communication devices requires increasing levels of on-chip integration to reduce component counts in order to maintain acceptable device "footprint" sizes and reduce overall power consumption.

SUMMARY

A circuit in accordance with embodiments of the present disclosure includes input circuitry having a constant gain amplification circuit. A variable gain amplification circuit is connected to the constant gain amplification circuit to produce an amplified signal from an output signal of the constant gain amplification circuit. A first processing circuit includes a first radio frequency circuit configured to receive the amplified signal from the variable gain amplification circuit. A second processing circuit includes a second radio frequency circuit configured to receive the output signal from the constant gain amplification circuit. A gain of the constant gain amplification circuit may be set to avoid clipping of the received radio frequency signal.

In some embodiments, the first processing circuit further include a variable gain amplification circuit. The second processing circuit further includes a variable gain amplification circuit.

In accordance with the disclosed embodiments, the first radio frequency circuit is configured to process signals in accordance with a first standard and the second radio frequency circuit is configured to process signals in accordance with a second standard different from the first standard. In some embodiments, the frequency range defined by the first standard overlaps a frequency range defined by the second standard.

In some embodiments, a circuit includes a first signal path having a constant gain amplifier and absent variable gain amplifier. A first RF signal processing circuit is connected to the first signal path. A second signal path includes the first signal path and a variable gain amplifier having an input to receive an output of the constant gain amplifier. A second RF signal processing circuit is connected to the second signal path. Gain control in the second signal path can be performed without affecting a gain in the first signal path.

In some embodiments, the first RF signal processing circuit is configured to process RF signals defined in accordance with the Bluetooth™ standard. The second RF signal processing circuit is configured to process RF signals defined in accordance the Wi-fi™ standard.

DETAILED DESCRIPTION

In the following description, for purposes of explanation, numerous examples and specific details are set forth in order to provide a thorough understanding of the present disclosure. It will be evident, however, to one skilled in the art that the present disclosure as defined by the claims may include some or all of the features in these examples alone or in combination with other features described below, and may further include modifications and equivalents of the features and concepts described herein. RF signals, as used herein, will be understood to refer to electromagnetic radiation preferably in the range between 3 Hz to 300 GHz, but can be located in other ranges as well.

Figure 1:
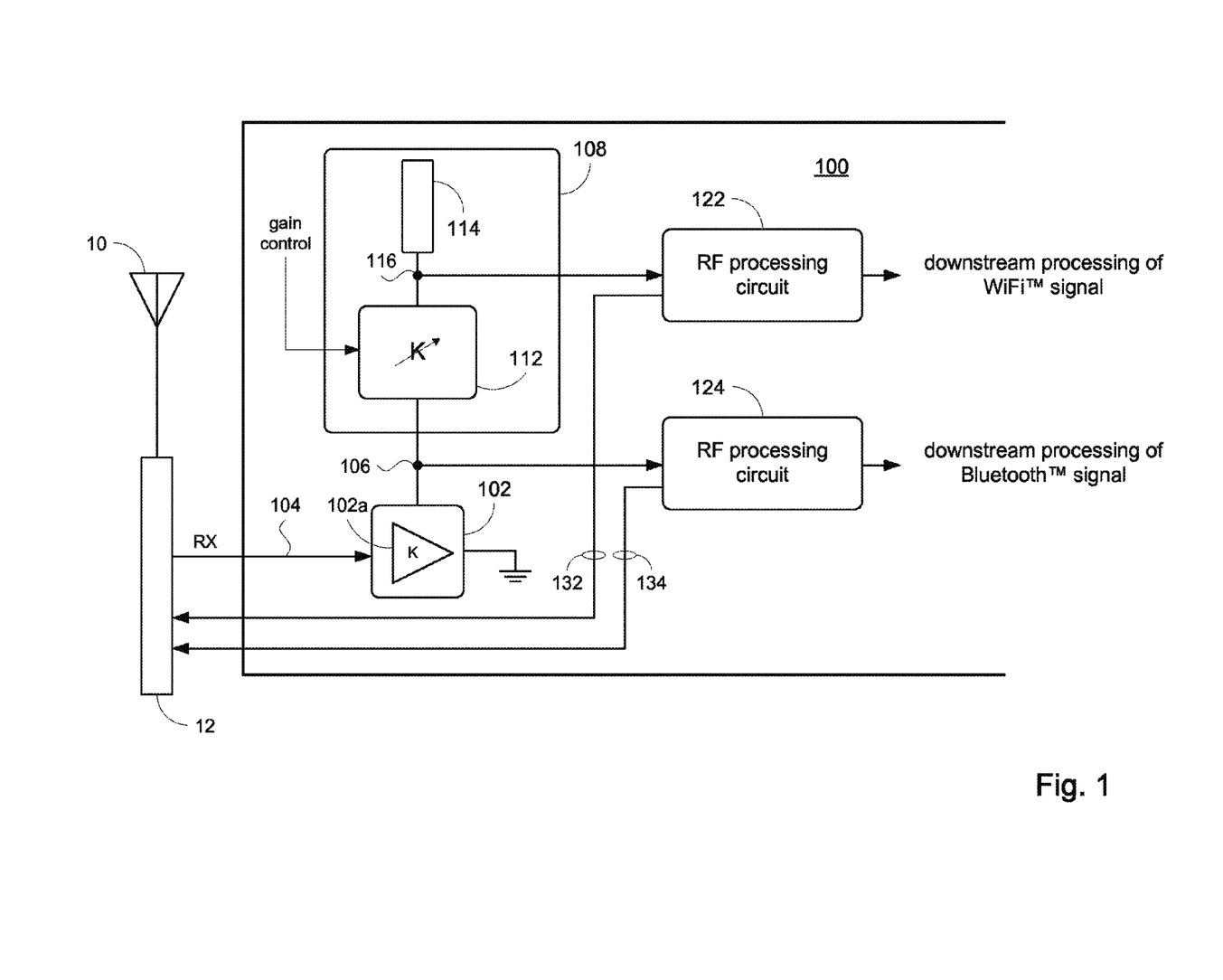
FIG. 1 is a block diagram of an RF communication circuit in accordance with the present disclosure.

Referring to FIG. 1, a front-end module in a radio frequency (RE) communication circuit 100 in accordance with embodiments of the present disclosure. In some embodiments, the RF communication circuit 100 may be configured as a system-on-chip (SOC) device. In other embodiments, the RF communication circuit 100 may employ other design methods. Complementary metal oxide semiconductor (CMOS) process technology may be used to fabricate the circuit. However, it will be appreciated that other process technologies can be used.

As illustrated in FIG. 1, in some embodiments, the RF communication circuit 100 includes input circuitry 102 having an input connected to an input terminal 104. RF signals received by an antenna 10 feed into the input circuitry 102. In an embodiment, the RF signals RX received by the antenna 10 feed into a suitable RF switch 12 which then feed into the input circuitry 102 via input terminal 104.

In accordance with principles of the present invention, the input circuitry 102 includes a constant gain amplification circuit 102a having an ideal gain K with some tolerance range ±N. In some embodiments, the gain factor K of the constant gain amplification circuit 102a is low to avoid clipping of the received signal RX. For example, the gain factor K may be 1 (unity gain), but may be any suitable value. The particular gain factor will depend on expected signal strengths, system noise specifications, linearity requirements, and so on.

In some embodiments, an output of the constant gain amplification circuit 102a is connected to a common point (node) 106. The output the node 106 connects to an input of a variable gain amplifier 108. An output of the variable gain amplifier 108 is connected to an input of an RF signal processing circuit 122.

In an embodiment, the variable gain amplifier 108 includes a gain control element 112 coupled to a load 114 at a common point (node) 116. A voltage across the load 114 at node 116 may serve as the output of the variable gain amplifier 108, and may be connected to the input of the RF signal processing circuit 122. The gain control element 112 is connected to node 106 to receive, as input, an output signal from the constant gain amplification circuit 102a of the input circuitry 102. A gain control signal feeds into the gain control element 112 to adjust its gain setting. In an embodiment, the gain control signal may be an n-bit control word, providing $2^n$ gain settings.

In an embodiment, the RF signal processing circuit 122 may include a Wi-Fi™ RF receiver to process received Wi-Fi™ RF signals. The received Wi-Fi™ signals may then be further processed downstream by suitable circuitry (not shown). The RF signal processing circuit 122 may include circuitry to generate Wi-Fi™ signals for transmission. An output 132 may feed a Wi-Fi™ signal into the switch 12 for transmission by the antenna 10.

In accordance with principles of the present invention, the output of the constant gain amplification circuit 102a is connected via node 106 to an input of another RF signal processing circuit 124. In an embodiment, the RF signal processing circuit 124 may include a Bluetooth™ RF receiver to process received Bluetooth™ RF signals. The received Bluetooth™ signals may then be further processed downstream by suitable circuitry (not shown). The RF signal processing circuit 124 may include circuitry to generate Bluetooth™ signals for transmission. An output 134 may feed a Bluetooth™ signal into the switch 12 for transmission by the antenna 10.

Figure 2:
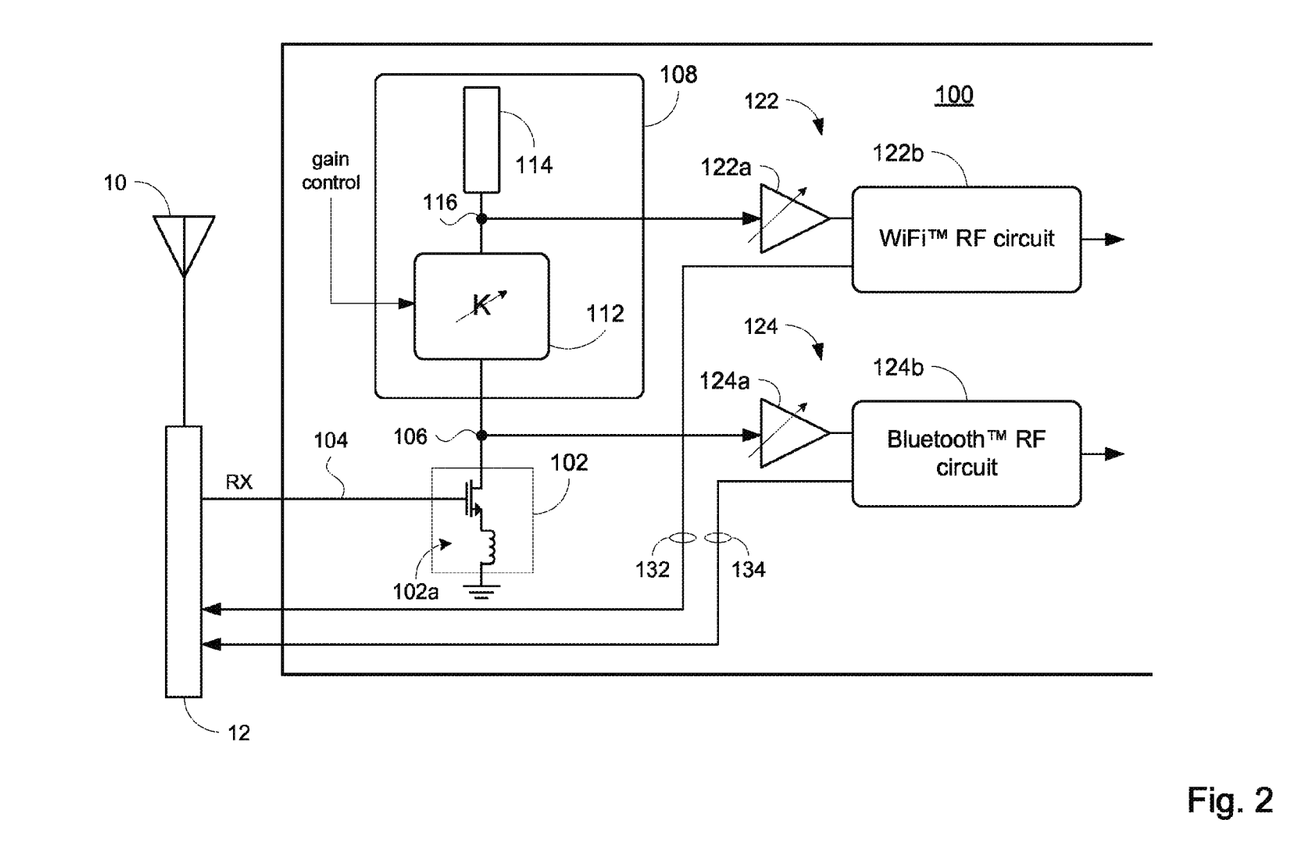
FIG. 2 is a block diagram of an RF communication circuit showing additional detail in the constant gain amplification circuit.

Referring to FIG. 2, in accordance with principles of the present invention, the input circuitry 102 includes a constant gain amplification circuit 102a. It will be appreciated that the constant gain amplification circuit 102a may comprise any suitable amplifier design having a constant gain. For example, the constant gain amplification circuit 102a may be a low noise transconductor stage.

FIG. 2 shows an example of a transconductor stage 102a that employs the well-known inductively degenerated low noise amplifier (LNA) design comprising a transistor device and an inductive element. The gain of the transconductor stage 102a is constant and can be set by choosing suitable design parameters for the transistor device and the inductive element. The voltage level of the received signal RX serves as an input signal to the transconductor stage 102a, and a resulting current flow through the transistor device serves as the output of the transconductor stage.

Figure 2A:
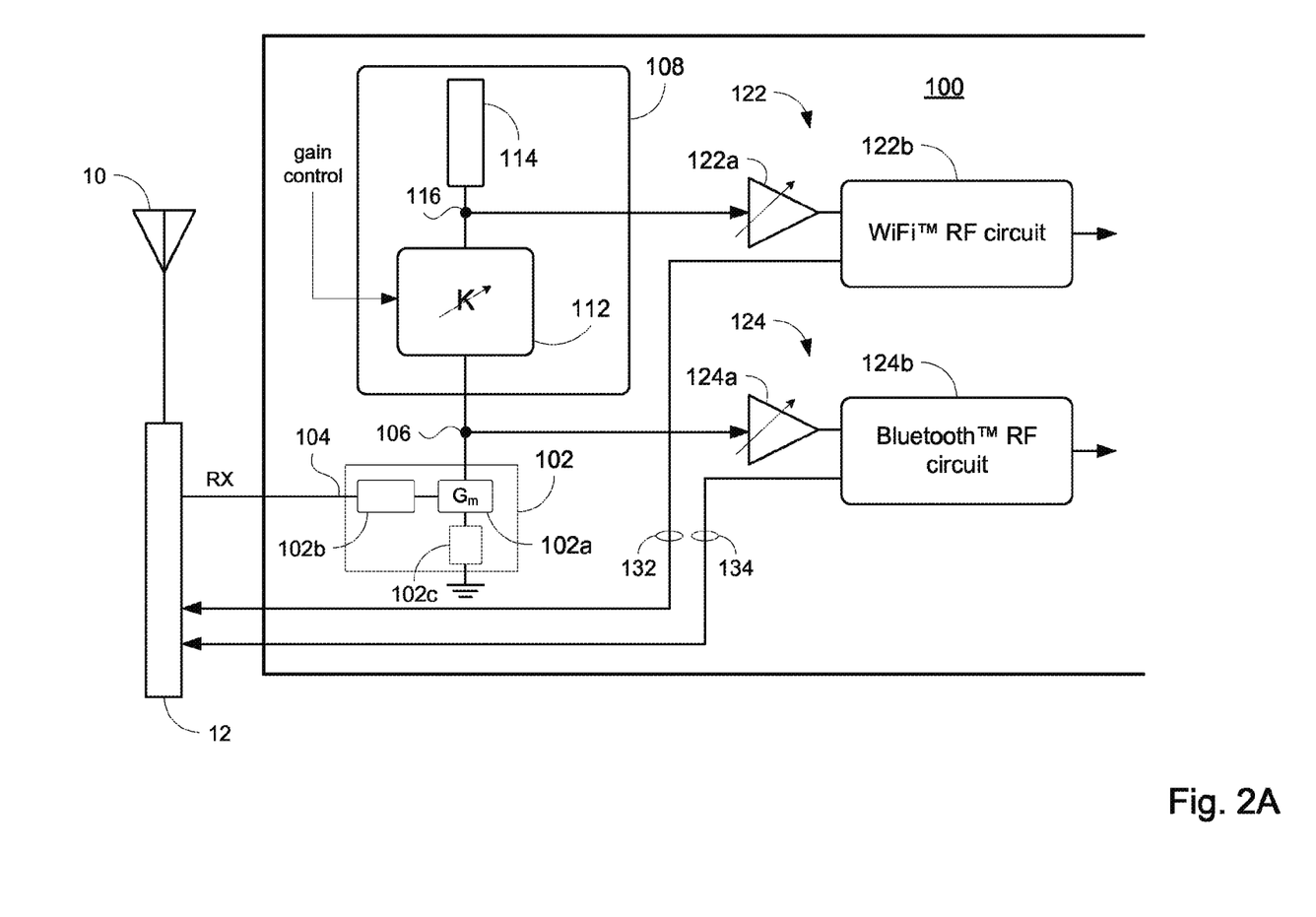
FIGS. 2A and 2B are block diagrams of an RF communication circuit showing additional detail in the RF circuits.

Referring fir a moment to FIG. 2A, in some embodiments, the input circuitry 102 may include a matching network comprising one more known matching circuits 102b and 102c to provide impedance matching of the antenna 10. Whether or not a matching network is needed will depend on the particular implementation, and the particular design for the matching circuits 102b and 102c will also depend on the particular implementation. In some embodiments, the matching circuits 102b and 102c may be "off-chip", which is to say that the circuit components are separate from the IC chip that embodies the RF communication circuit 100. In other embodiments, the matching network may be "on-chip" (as shown in FIG. 2A), which is to say that the circuit components are fabricated on the same IC chip. In still other embodiments, the matching network may be partly off-chip and partly on-chip.

Figure 2B:
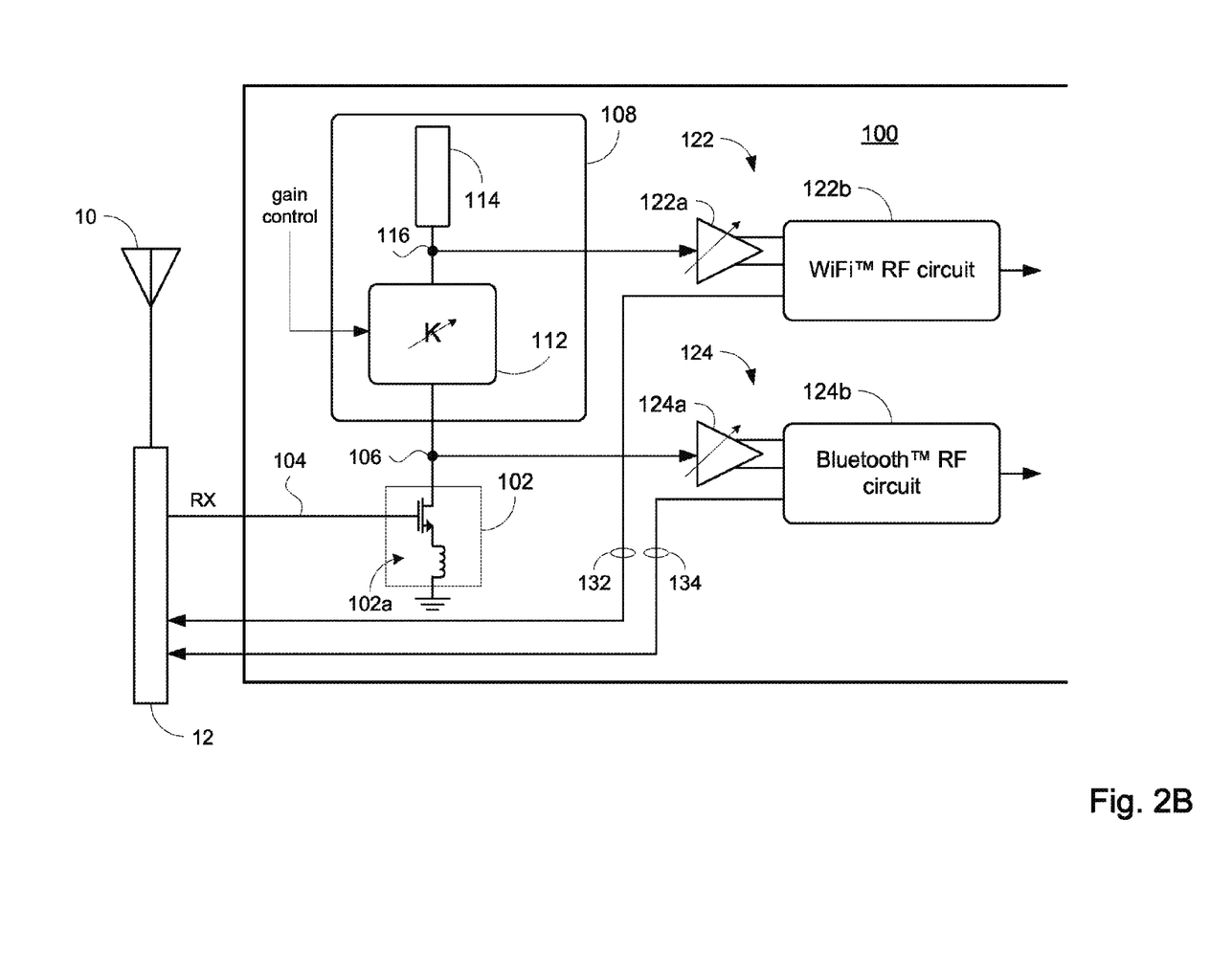

Returning to FIG. 2, in some embodiments, the RF signal processing circuit 122 may include an additional variable gain amplifier. For example, in the embodiment shown in FIG. 2, the RF signal processing circuit 122 includes a variable gain amplifier 122a connected to receive the output from variable gain amplifier 108. The output of the variable gain amplifier 122a feeds into the RF receiver 122b; for example, as shown in the figure, the RF receiver 122b may be a Wi-Fi™ RF receiver. The variable gain amplifier 122a may provide additional control over the gain of the received signal RX. The variable gain amplifier 122a shown in FIG. 2 outputs a single-ended signal. Referring for a moment to FIG. 2B, in some embodiments, the variable gain amplifier 122a may output a differential signal instead. However, it should be appreciated that the variable gain amplifier 122a may be of any suitable design.

The RF signal processing circuit 124 may include a variable gain amplifier. In the embodiment shown in FIG. 2, the RF signal processing circuit 124 may include a variable gain amplifier 124a connected to receive the output from the constant gain amplification circuit 102a of the input circuit 102. The output of the variable gain amplifier 124a feeds into the RF receiver 124b; for example, a Bluetooth™ RF receiver. The variable gain amplifier 124a may provide control over the gain of the signal, since the incoming signal is subject only to a constant (and low) gain of the constant gain amplification circuit 102a. The variable gain amplifier 124a shown in FIG. 2 outputs a single-ended signal. Referring for a moment to FIG. 2B, in some embodiments, the variable gain amplifier 124a may output a differential signal instead. However, it should be appreciated that the variable gain amplifier 124a may be of any suitable design.

Figure 3:
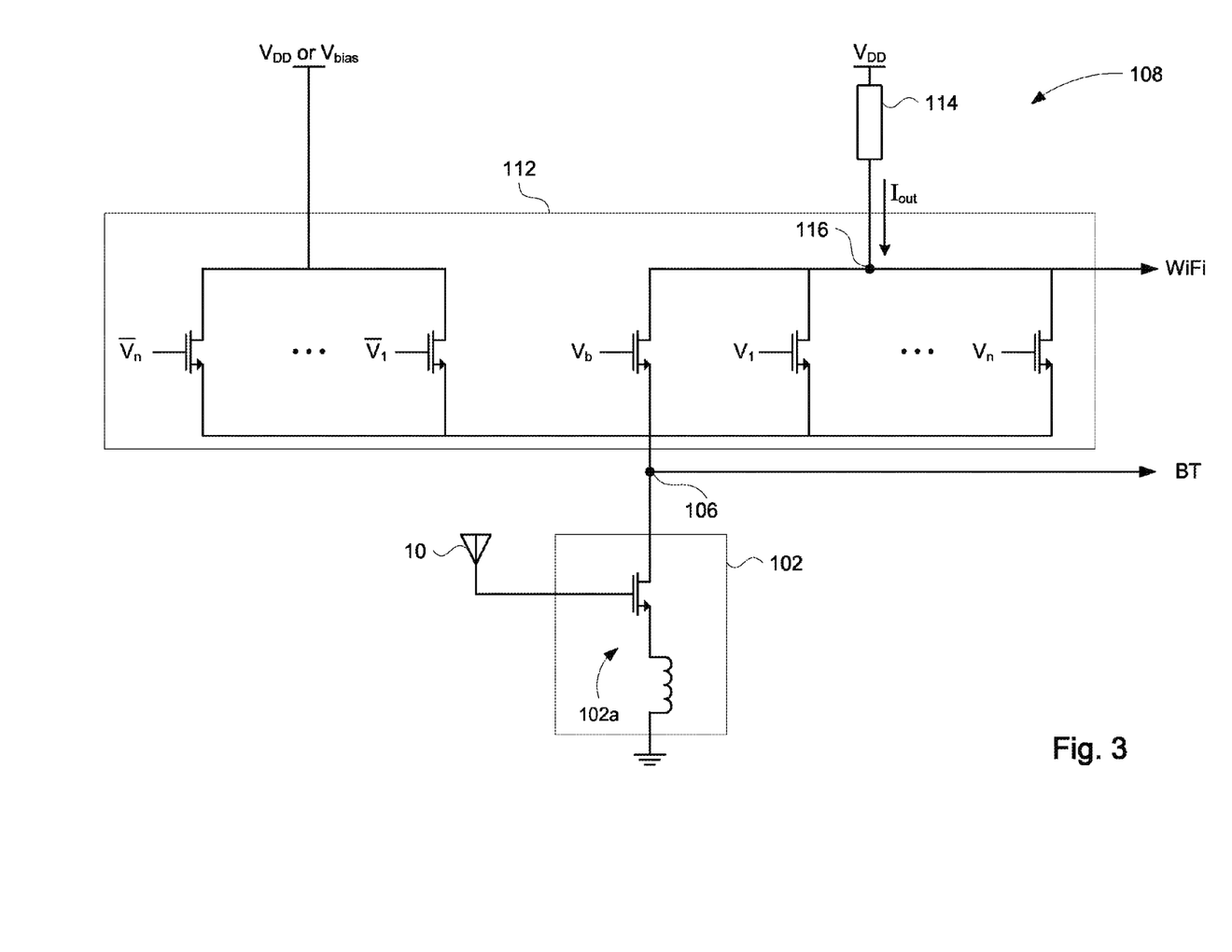
FIGS. 3 and 4 show embodiments of the gain control element shown in FIG. 1.

The variable gain amplifier 108 may be implemented in a variety of ways. Referring to FIG. 3, in some embodiments, the variable gain amplifier 108 may employ a commonly known cascode design. Gain control can be achieved by selectively biasing the transistors that comprise the gain control element 112. The voltage level at node 116 can be controlled (and hence the gain) by controlling the amount of current that flows across the load 114. The load 114 can be any suitable element, such as a resistor. The voltage at node 116 can then be coupled to the RF signal processing circuit 122 (e.g., Wi-Fi™ RF circuitry). By biasing the transistors that comprise the gain control element 112, the current flow through the load 114 can be controlled and hence the voltage at node 116.

Figure 4:
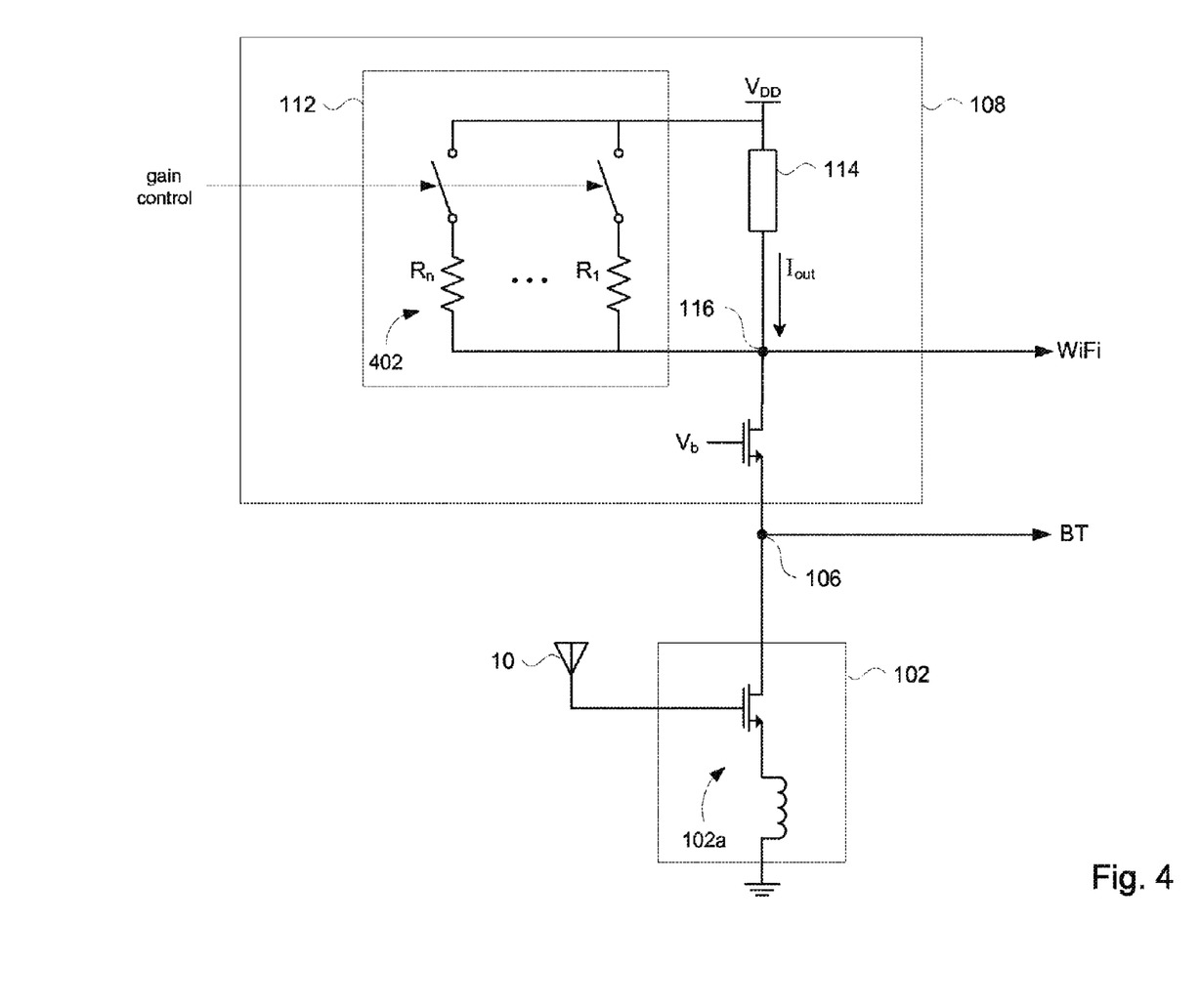

Referring to FIG. 4, in some embodiments, the gain control element 112 may comprise a programmable resistor 402 to resistively load the load 114. FIG. 4 shows a logical representation of a programmable resistor 402. Different resistor elements $R_n$-$R_1$ or combinations of resistor elements can be engaged to vary the loading on the load 114. The voltage on node 116 will vary according to the total load. Programmable resistor designs are well known, and any suitable design may be used.

Figure 5:
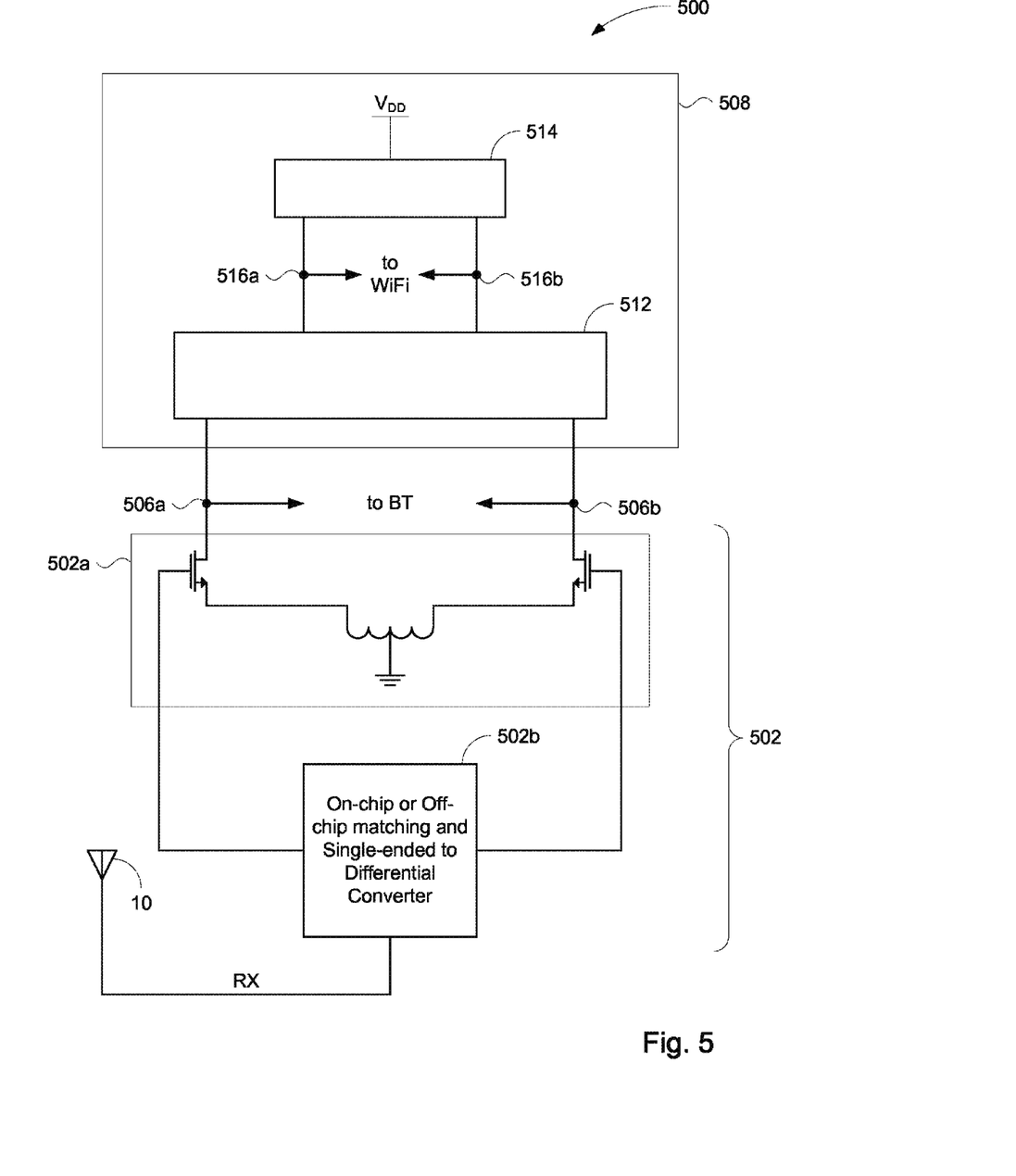
FIG. 5 is a block diagram of a differential RF communication circuit in accordance with the present disclosure.

In some embodiments, an RF communication circuit in accordance with principles of the present invention may employ a differential implementation of the front-end module. Referring to FIG. 5, a differential front-end module for an RF communication circuit 500 may include an input circuit 502 comprising a differential constant gain amplification circuit 502a. For example, the differential constant gain amplification circuit 502a may be a differential transconductor, but can be any suitable differential amplifier with constant gain. The input circuit 502 may include a suitable matching network 502b. Differential outputs of the differential constant gain amplification circuit 502a are connected to common points (nodes) 506a and 506b. The nodes 506a and 506b serve as differential inputs into RF signal processing circuitry; for example, a Bluetooth™ receiver.

The input circuit 502 may include a block 502b that comprises suitable matching network. The matching network may be off-chip or on-chip, depending on the design and the size of the components of the matching network. Portions of the matching network may be on-chip and portions may be off-chip, and so on. The block 502b may also include a single-ended to differential converter in order to convert the received signal RX from the antenna 10 into a suitable differential signal.

Figure 6:
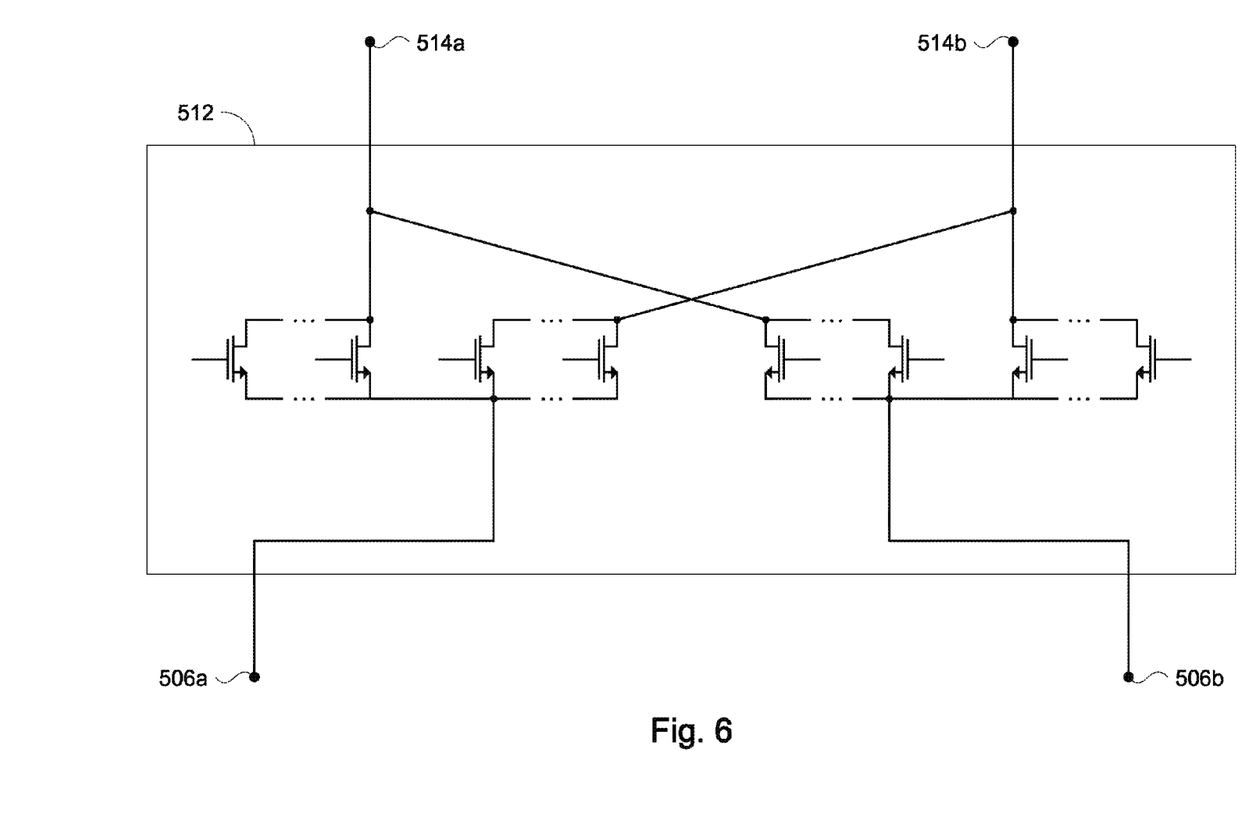
FIGS. 6 and 7 show differential implementations of the gain control element shown in FIG. 5.
Figure 7:
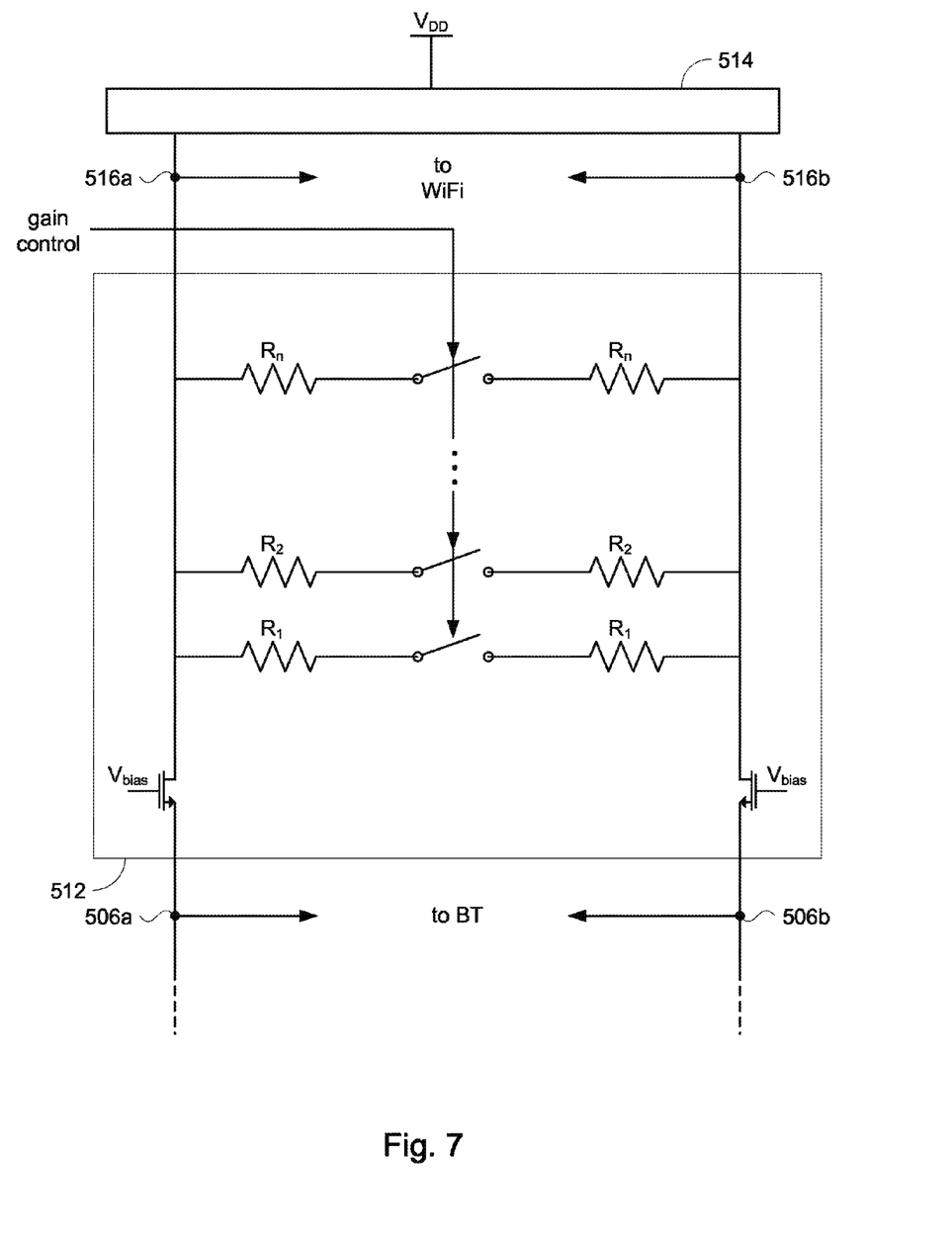

The nodes 506a and 506b also serve as differential inputs into a differential variable gain amplifier 508, which comprises a differential gain control circuit 512 and a differential load 514. In an embodiment, the differential gain control element 512 comprises a differential cascode, such as shown in FIG. 6. In an embodiment, the differential gain control element 512 comprises a differential resistor network, such as shown in FIG. 7.

Differential outputs of the differential variable gain amplifier 508 are connected to common points (nodes) 516a and 516b. The nodes 516a and 516b serve as differential inputs into RF signal processing circuitry; for example, a Wi-Fi™ receiver.

An RF communication circuit 100 in accordance with the present disclosure can be advantageous for receiving RF signals that are compliant with the Wi-Fi™ standard concurrently with RF signals that are compliant with the Bluetooth™ standard. The Wi-Fi™ standard is based on IEEE 802.11, a set of standards for implementing wireless local area network (WLAN) computer communication. The Bluetooth™ standard is a proprietary wireless technology standard created by the telecom company Ericsson. Both standards define RF signals in the substantially the same frequency band, about 2.4-2.5 GHz. Accordingly, off-chip RF components, such as antenna 10, switch 12, and so on, can be shared. RF input pads on a chip (e.g., a SOC device) that embodies the RF communication circuit 100 likewise can be shared.

The strength of a received signal, such as Wi-Fi™ or Bluetooth™, can vary over a wide range. When the signal strength is low, it may be desirable to amplify the signal in order to maximize the signal to noise ratio (SNR) of the received signal before feeding the signal into a signal processing circuit (e.g., receiver circuitry). Conversely, when the signal strength is high, it may be desirable to reduce the amount of amplification in order to avoid clipping the signal and thus avoid distortions before feeding the signal into the signal processing circuit. Being able to vary the signal gain can therefore enhance the dynamic range of the signal processing circuit.

However, the strength of a Wi-Fi™ compliant RF signal can vary independently of a Bluetooth™ signal. Consequently, if the gain is increased in order to pull in a weak Wi-Fi™ signal in the presence of a strong Bluetooth™ signal, then it is possible that the Bluetooth™ signal may be clipped, and vice versa.

Figure 8A:
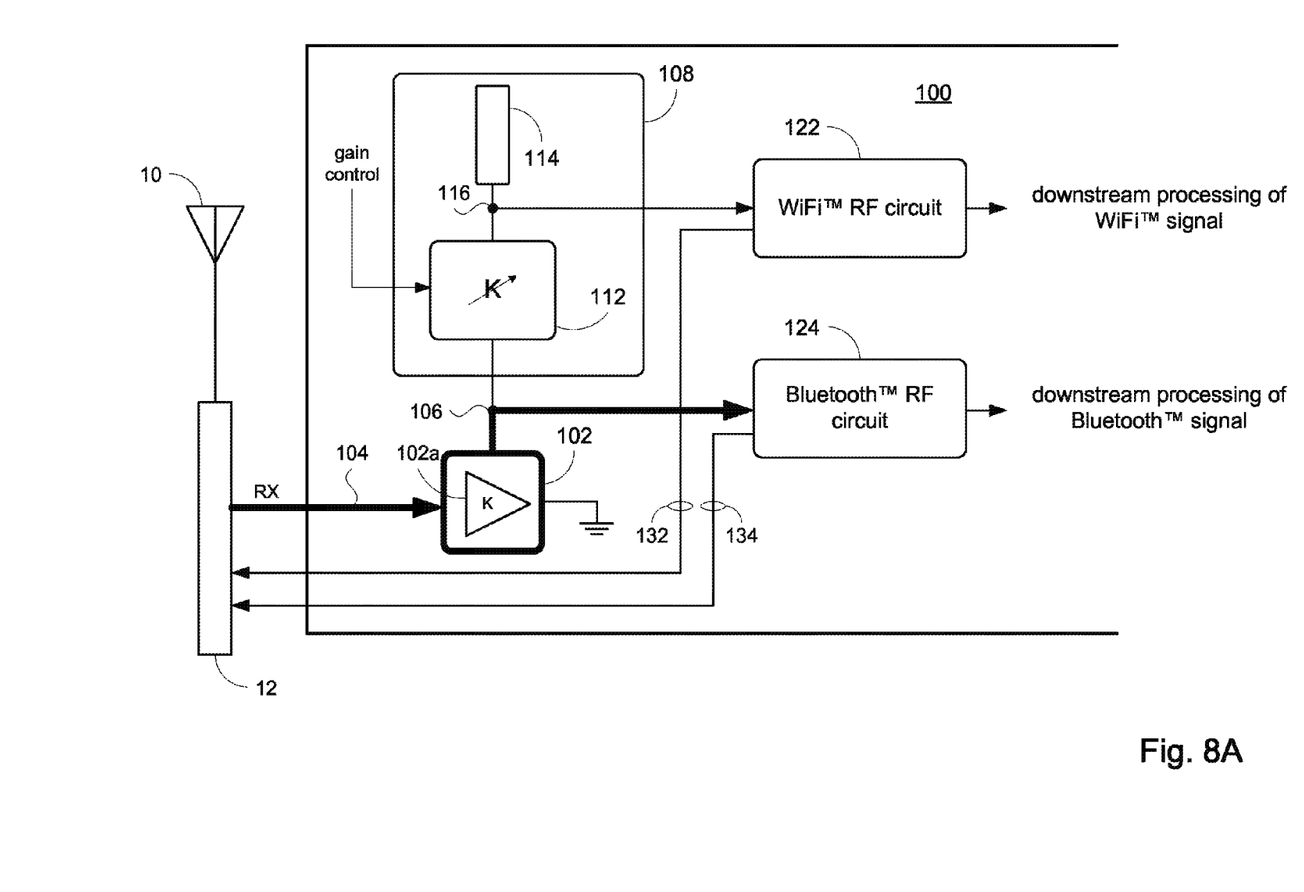
FIGS. 8A and 8B illustrate the independent signal paths provided by the RF communication circuit in accordance with principles of the present invention.
Figure 8B:
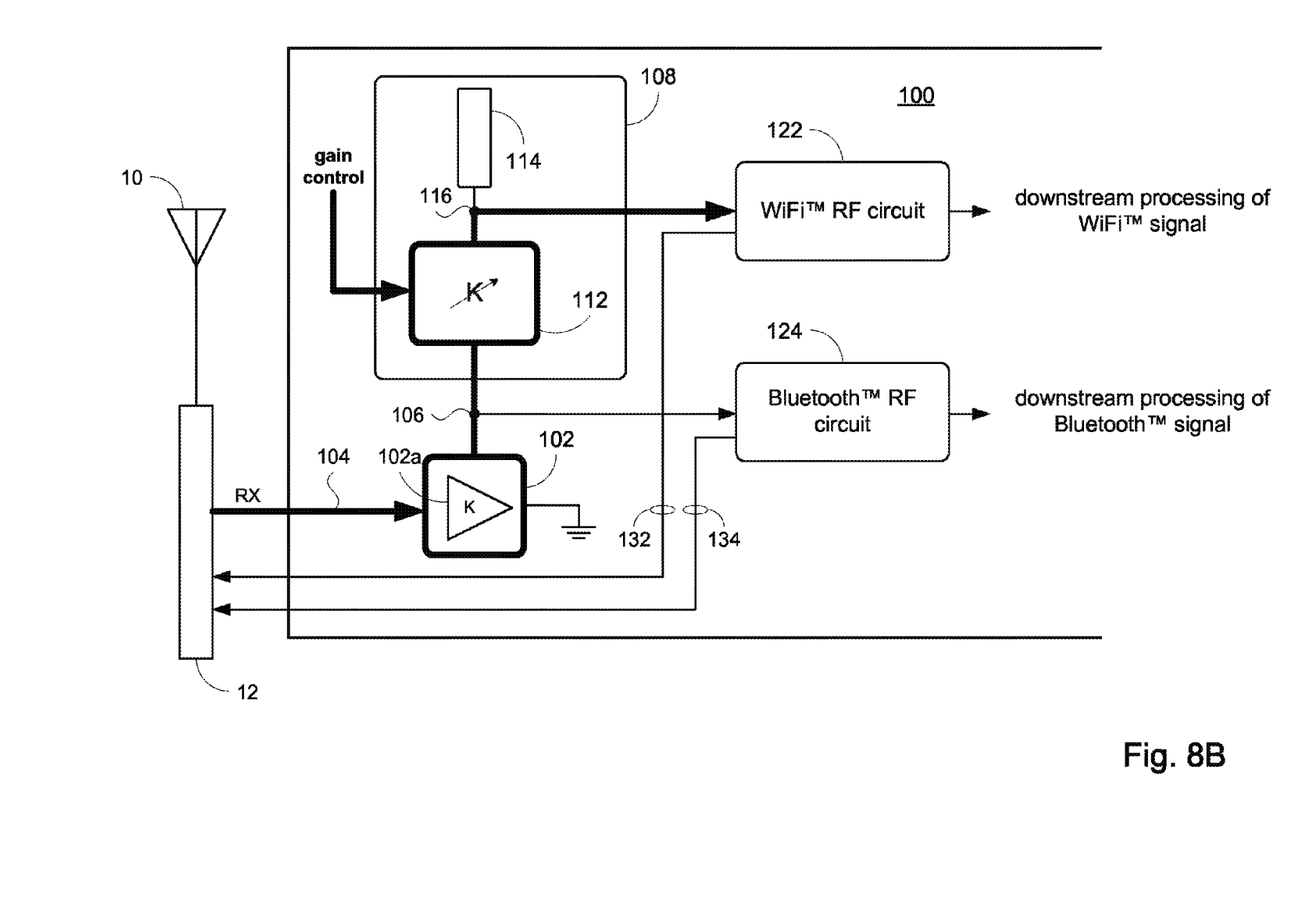

Referring to FIGS. 8A and 8B, operation of an RF communication circuit 100 in accordance with principles of the present invention provides two signal paths for received RF signals. FIG. 5A highlights a first signal path which feeds RF signals received by the antenna 10 into the RF signal processing circuit 124. RF signals received by the antenna 10 are amplified by the constant gain amplification circuit 102a. Output signals from the constant gain amplification circuit 102a feed into the RF signal processing circuit 124. FIG. 5B highlights a second signal path in which the same output signals from the constant gain amplification circuit 102a feed into the variable gain amplifier 108. Output signals from the variable gain amplifier 108 then feed into the RF signal processing circuitry 122.

With reference to FIG. 8B, in an embodiment, the RF signal processing circuitry 122 includes a Wi-Fi™ RF circuit. Automatic gain control can be performed along the second signal path by controlling the gain control signal of the variable gain amplifier 108. The signal gain can be varied depending on processing by the RF signal processing circuitry 122 of the received signal. As shown in FIG. 8A, the received signal can be tapped off at node 106, prior to amplification by the variable gain amplification circuit 108, and fed into RF signal processing circuitry 124, such as a Bluetooth™ RF circuit.

It can be appreciated that the first signal path and the second signal path constitute independently gain controlled signal paths. The first signal path is gain controlled by the constant gain K of the constant gain amplification circuit 102a, while the second signal path is gain controlled by the constant gain K and the variable gain amplifier 108. Thus, the gain K of the constant gain amplification circuit 102a can be based on the expected signal strength of the stronger of the two signals. Amplifying the received signal by the gain K will ensure against clipping the stronger signal when it feeds into the RF signal processing circuitry 124. The weaker of the two signals can be further amplified to improve SNR) by the variable gain amplifier 108 before being fed into the RF signal processing circuitry 122. In addition, the constant gain amplification circuit 102a acts as a buffer between the circuit elements of the RF communication circuit 100 and the external RF components such as the antenna 10 which can otherwise be adversely affected by any parasitic effects that might arise in the RF communication circuit.

Figure 9:
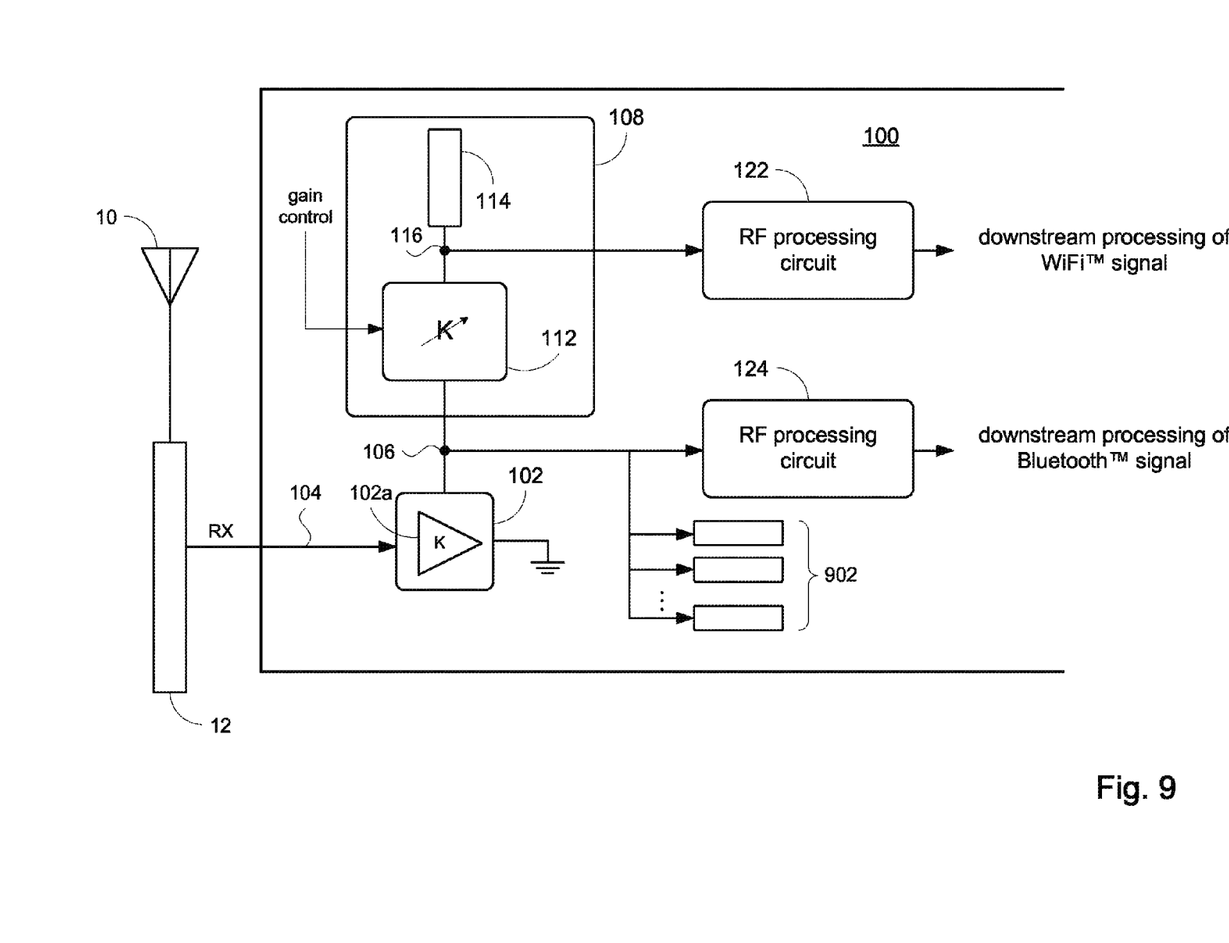
FIG. 9 illustrates the incorporation of additional RF signal processing circuitry in accordance with the present disclosure.

Referring to FIG. 9, in some embodiments, additional RF signal processing circuitry can be provided to handle situations where more than two RF signal standards are involved. The figure shows additional RF signal processing units 902 that can tap off of node 106. It is noted that the constant gain amplification circuit 102a may require impedance matching to cover all the frequency bands of the multiple RF signal standards.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present disclosure along with examples of how the disclosed embodiments may be implemented. The above examples and embodiments should not be deemed to be the only embodiments, and are presented to illustrate the flexibility and advantages of aspects of the present invention as defined by the following claims. Based on the above disclosure and the following claims, other arrangements, embodiments, implementations and equivalents will be evident to those skilled in the art and may be employed without departing from the spirit and scope of the claims.

What is claimed is:

1. A method comprising:
   receiving, with a first amplification circuit, a signal from a source to produce an output signal;
   producing, with a second amplification circuit, an amplified signal from the output signal;
   processing the output signal with first processing circuitry; and
   processing the amplified signal with second processing circuitry, wherein each of the first processing circuitry and the second processing circuitry includes a radio frequency circuit.

2. The method of claim 1, wherein the first amplification circuit is a constant gain circuit and the second amplification circuit is a variable gain circuit.

3. The method of claim 2, wherein the constant gain circuit has a substantially constant gain.

4. The method of claim 1, wherein the first processing circuitry and the second processing circuitry each includes an additional amplification circuit.

5. The method of claim 1, wherein the source is an antenna.

6. The method of claim 1 further comprising setting a gain of the first amplification circuit to a value that prevents clipping of the received signal.

7. The method of claim 1, wherein the amplified signal is processed in accordance with a first standard and the output signal is processed in accordance with a second standard.

8. The method of claim 7, wherein a frequency range defined by the first standard overlaps a frequency range defined by the second standard.

9. The method of claim 1 further comprising receiving the output signal with third processing circuitry.

10. A method comprising:
    receiving a signal via a first signal path, the first signal path including a constant gain amplifier;
    coupling first processing circuitry to the first signal path;
    receiving via a second signal path an output of the constant gain amplifier, wherein the second signal path includes a variable gain amplifier; and
    coupling second processing circuitry to the second signal path, wherein gain control in the second signal path can be performed without affecting a gain in the first signal path.

11. The method of claim 10, wherein the first signal path excludes a variable gain amplifier.

12. The method of claim 10, wherein each of the first processing circuitry and the second processing circuitry includes a variable gain amplifier.

13. The method of claim 10 further comprising:
    processing, with the first processing circuitry, the signal in accordance with a first RF standard; and
    processing, with the second processing circuitry, the output of the constant gain amplifier in accordance with a second RF standard.

14. The method of claim 10, wherein each of the first processing circuitry and the second processing circuitry includes a radio frequency circuit.

15. A method comprising:
    receiving, with a constant gain amplification circuit, a varying voltage level based on an input signal received from a source device;
    receiving, with a first variable gain amplification circuit, an output of the constant gain amplification circuit;
    coupling first processing circuitry to receive an output of the first variable gain amplification circuit;
    receiving, with a second variable gain amplification circuit, the output of the constant gain amplification circuit; and
    processing, with second processing circuitry, an output of the second variable gain amplification circuit, wherein signals received by the first processing circuitry have a frequency band that overlaps a frequency band of signals received by the second processing circuitry.

16. The method of claim 15, wherein the constant gain amplification circuit includes a transconductor stage.

17. The method of claim 15, wherein the source device is antenna.

18. The method of claim 15 further comprising:
    transmitting, with the first processing circuitry, a first transmit signal using the source device; and
    transmitting, with the second processing circuitry, a second transmit signal using the source device.

19. The method of claim 15, wherein each of the first processing circuitry and the second processing circuitry includes a radio frequency circuit.

* * * * *